(12) United States Patent
Amirkhany et al.

(10) Patent No.: US 9,484,891 B2
(45) Date of Patent: Nov. 1, 2016

(54) MULTI-MODAL COMMUNICATION INTERFACE

(75) Inventors: Amir Amirkhany, Sunnyvale, CA (US); Chaofeng Huang, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 764 days.

(21) Appl. No.: 13/880,960

(22) PCT Filed: Jan. 24, 2012

(86) PCT No.: PCT/US2012/022386
§ 371 (c)(1),
(2), (4) Date: Jul. 9, 2013

(87) PCT Pub. No.: WO2012/103106
PCT Pub. Date: Aug. 2, 2012

(65) Prior Publication Data
US 2013/0278296 A1 Oct. 24, 2013

Related U.S. Application Data

(60) Provisional application No. 61/436,079, filed on Jan. 25, 2011.

(51) Int. Cl.
*H03K 3/01* (2006.01)
*H01L 27/02* (2006.01)
*H03K 19/003* (2006.01)
*H03K 19/0185* (2006.01)

(52) U.S. Cl.
CPC ............ *H03K 3/01* (2013.01); *H01L 27/0251* (2013.01); *H03K 19/00315* (2013.01); *H03K 19/018521* (2013.01); *H03K 19/018528* (2013.01)

(58) Field of Classification Search
CPC .......... H03K 3/01; H03K 19/018521; H03K 19/018528; H03K 19/00315
USPC ..................................... 326/80, 81
See application file for complete search history.

(56) References Cited

U.S. PATENT DOCUMENTS

| | | | | |
|---|---|---|---|---|
| 6,271,679 | B1 * | 8/2001 | McClintock | H03K 19/17744 326/38 |
| 6,674,304 | B1 * | 1/2004 | Matthews | H03K 17/167 326/63 |
| 8,179,160 | B1 * | 5/2012 | Chauhan | H03K 3/356182 326/26 |
| 8,421,517 | B2 * | 4/2013 | Marumoto | H04N 5/765 326/80 |
| 2005/0225924 | A1 | 10/2005 | Sibrai | |
| 2007/0042722 | A1 | 2/2007 | Kim | |

(Continued)

OTHER PUBLICATIONS

Amirkhany et al., "A 12.8-Gb/s/link Tri-Modal Single-Ended Memory Interface for Graphics Applications," Rambus Inc., Jun. 17, 2011. 2 pages.

(Continued)

*Primary Examiner* — Don Le
(74) *Attorney, Agent, or Firm* — Silicon Edge Law Group LLP; Arthur J. Behiel

(57) ABSTRACT

An integrated circuit supports multiple communication modes using different input/output (IO) voltages. The IC includes a low-voltage communication circuit operating at a low IO voltage in a low-voltage mode, and a high-voltage communication circuit operating at a high IO voltage in a high-voltage mode. The low-voltage communication circuit includes low-voltage transistors in a critical path that exhibits sensitivity to a destructive voltage less than the high IO voltage. The low-voltage communication circuit is therefore provided with protection circuitry to protect the low-voltage transistors from the high 10 voltage.

25 Claims, 4 Drawing Sheets

(56) References Cited

U.S. PATENT DOCUMENTS

2008/0039025 A1   2/2008   Ray et al.
2011/0001463 A1   1/2011   Jang et al.

OTHER PUBLICATIONS

Dettloff et al., "20.6: A 32mW 7.4Gb/s Protocol-Agile Source-Series-Terminated Transmitter in 45nm CMOS SOI," ISSCC 2010, Session 20, Digest of Technical papers, pp. 370-373. 3 pages.

Hatamkhani et al., "A 10-mW 3.6-Gbps I/O Transmitter," Jun. 2003, 2003 Symposium on VLSI Circuits, Digest of Technical Papers, pp. 97-98. 2 pages.

Kaviani et al., "A Tri-Modal 20Gbps/link Differential/DDR3/GDDR5 Memory Interface," Rambus Inc., Jun. 2011, 2011 Symposium on VLSI Circuits, Digest of Technical Papers, pp. 234-235. 2 pages.

Partovi et al., "Single-Ended Transceiver Design Techniques for 5.33GB/s Graphic Applications," ISSCC 2009, Session 7, 7.5, pp. 135-137. 3 pages.

* cited by examiner

MULTI-MODAL COMMUNICATION INTERFACE

BACKGROUND

Output driver circuits, or simply "drivers," transmit electronic signals onto various forms of communication channels, including transmission lines, cables, printed circuit board traces, or the like. Receivers on the opposite ends of the channels sense the electronic signals. There are many types and classes of drivers and receivers, each offering a combination of traits that make it more or less suitable for particular applications. For example, a "single-ended" (SE) driver transmits an information signal as a varying voltage or current signal over a single conductor; a single-ended receiver recovers the information by comparing the signal to a reference. The main alternative to the single-ended approach is differential signaling, in which a differential driver transmits information as complementary signals over a pair of conductors, and a differential receiver compares the complementary signals to recover the data. Single-ended communication circuits are simpler and less expensive, whereas differential circuits offer relatively higher noise tolerance.

Communication circuits and the signaling schemes they support are not limited to differential or single-ended signaling. There are other classes of signaling, and many species of the various classes. Integrated-circuit (IC) vendors can design their ICs to include drivers and receivers optimized for a specific application, but often prefer to address a larger market by supporting multiple signaling schemes. For example, newer IC processes produce smaller transistors, which use less power and area while nevertheless providing improved speed performance. Newer IC designs may therefore support faster, more efficient signaling schemes. Unfortunately, the small transistors that support higher performance and reduced cost and area may be damaged by the higher voltages employed by older signaling schemes, and so may not be compatible with legacy devices and legacy signaling schemes. IC vendors thus prefer that their IC's include communications circuits that offer both the speed performance of state-of-the-art processes and legacy support for older communication schemes. The resulting circuits can be complex, area-intensive, and expensive, and one or more of the supported signaling schemes may suffer reduced performance as compared with a tailored solution. There is therefore a need for improved multi-modal drivers and receivers.

BRIEF DESCRIPTION OF THE FIGURES

The figures are illustrations by way of example, and not by way of limitation. Like reference numerals in the figures refer to similar elements.

DETAILED DESCRIPTION

Figure 1:
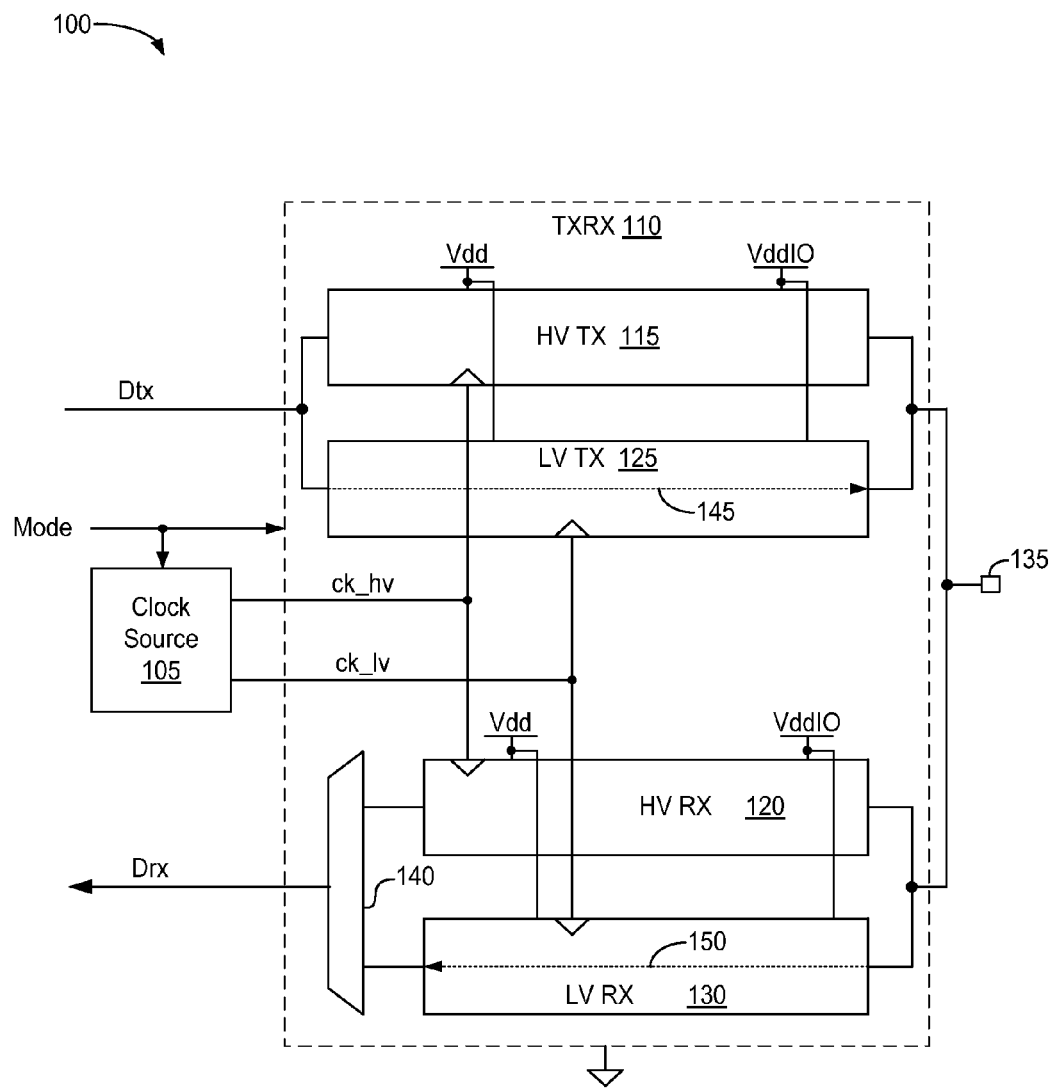
FIG. 1 depicts a multi-modal transceiver 100 instantiated on an integrated circuit (IC) in accordance with one embodiment.

FIG. 1 depicts a multi-modal transceiver 100 instantiated on an integrated circuit (IC) in accordance with one embodiment. Transceiver 100 includes two transmitter/receiver pairs that are alternatively enabled to support either a high-voltage (HV) communication scheme in an HV mode or a low-voltage (LV) communication scheme in an LV mode. In one embodiment, for example, the HV scheme supports a double data rate (DDR) signaling scheme using a 1.5V input/output (IO) voltage, whereas the LV scheme supports a relatively faster and energy efficient signaling scheme using a 1.0V IO voltage.

Transceiver 100 includes a clock source 105 and a transceiver block 110, both of which receive a mode signal Mode that distinguishes between the LV and HV modes. When the HV mode is selected, two of four communication circuits are enabled, an HV transmitter 115 and an HV receiver 120. The remaining two communication circuits, an LV transmitter 125 and an LV receiver 130, are disabled. Also in the HV mode, clock source 105 delivers a clock signal ck_hv that provides the appropriate timing to the HV transmitter and receiver blocks, and a relatively high 1.5V IO voltage is applied to IO supply node VddIO. A lower core voltage of e.g. 0.9V powers circuitry internal to the IC and is applied to a core supply node Vdd. In this mode HV transmitter 115 conveys (e.g., amplifies and/or level-shifts) data signals Dtx on a like-named input port to convey the data on an output port coupled to an IO pad 135, and consequently to a receiver external to the IC. HV receiver 120 conveys data received on the same pad 135 to recover received data Drx. A multiplexer 140 selects the output of receiver 120 in the HV mode responsive to the mode select signal Mode.

LV transmitter 125 and LV receiver 130 have respective critical paths 145 and 150 that are implemented using transistors that have relatively thin gate dielectrics, as compared with those of the HV driver, to support improved speed performance. As detailed in connection with later figures, these low-voltage transistors can be damaged by over-voltage conditions, and so are protected against the relatively high voltages applied to IO supply node VddIO and pad 135 in the HV mode. In another embodiment, the HV circuit may be implemented using transistors having the same thin gate dielectrics as in the LV circuit, but the transistors in the HV circuit are protected from the IO voltage, for example with a raised ground node.

LV transmitter 125 and LV receiver 130 are enabled when the LV mode is selected, and HV transmitter 115 and HV receiver 120 are disabled. Transmitter 125 conveys data signals Dtx to an IO pad 135. Receiver 130 conveys data from the same pad 135 to recover received data Drx. Multiplexer 140 selects the output of receiver 130 in the LV mode responsive to the mode select signal Mode. Clock source 105 provides a clock signal ck_lv that provides the timing appropriate for the LV mode. A relatively low 1.0V IO voltage is applied to IO supply node VddIO. The 0.9V core voltage applied to supply node Vdd is the same in both modes in this embodiment.

Figure 2:
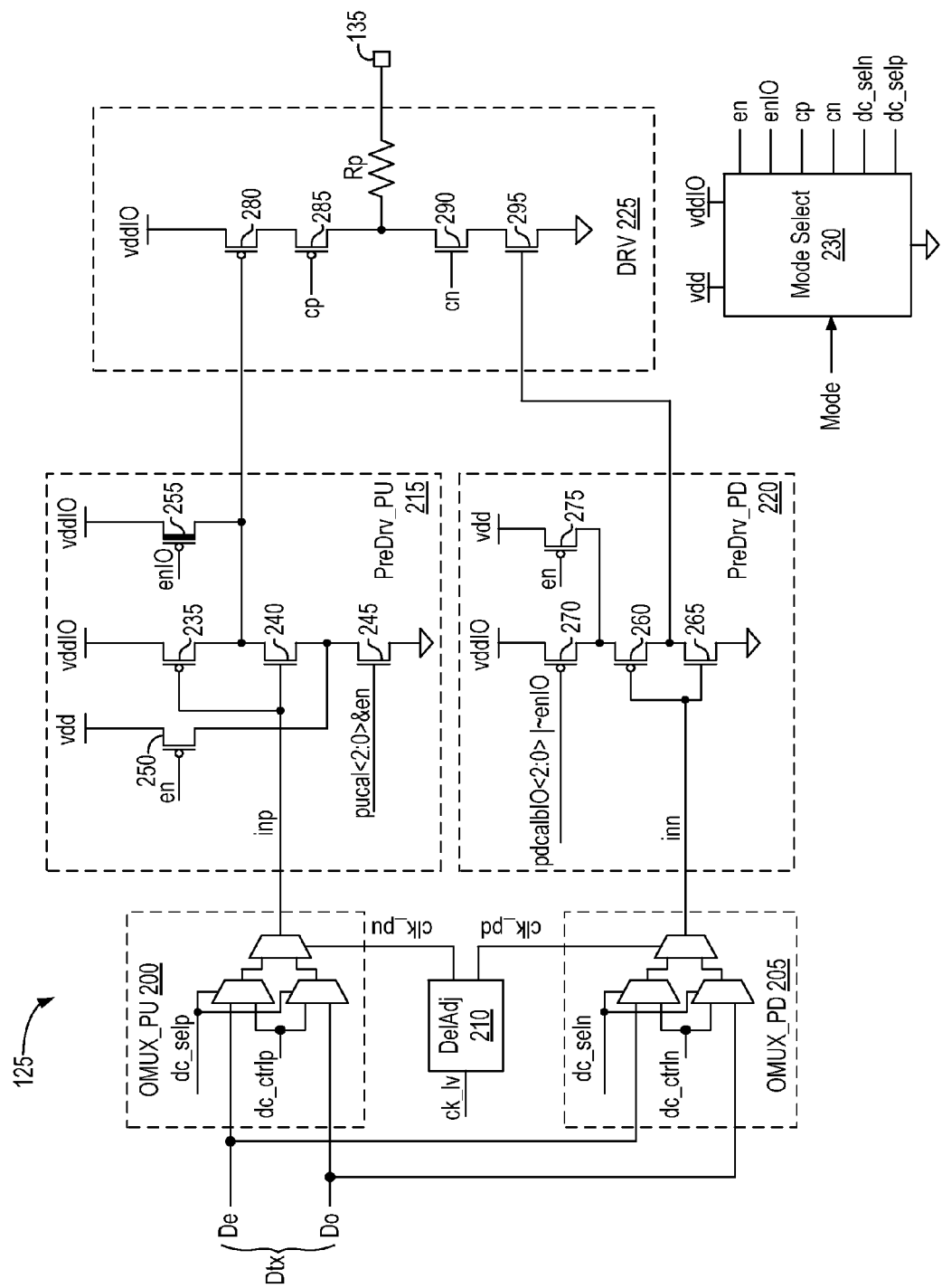
FIG. 2 depicts an embodiment of a low-voltage (LV) transmitter 125 of FIG. 1.

FIG. 2 depicts an embodiment of LV transmitter 125 of FIG. 1. Transmitter 125 includes complementary output multiplexers 200 and 205, a clock-delay adjustment circuit 210, complementary pull-up and pull-down predrivers 215 and 220, a driver 225, and mode-select circuit 230.

Data Dtx arrives at multiplexers 200 and 205 as odd and even half-rate data De and Do. Each multiplexer converts even and odd data De and Do to bit-rate data timed to clock signal ck_lv. Delay-adjustment circuit 210 independently phase adjusts the clock signal to provide respective clock signals clk_pu and clk_pd. The independent adjustment supports separate timing calibration for rising and falling output-signal edges. Multiplexers 200 and 205 receive respective control signals dc_selp and dc_seln. When one of these signals is asserted, a respective DC signal dc_ctrlp or dc_ctrln is conveyed to the respective multiplexer output, thereby disabling the corresponding predriver or predrivers. When these control signals are not asserted (i.e., are deasserted), odd and even data signals Do and De are alternatively conveyed to both predrivers 215 and 220 as identical signals inp and inn on like-identified nodes. Nodes inp and inn, collectively a data input port, mark the beginning of the critical path for data through predrivers 215 and 220 and output driver 225.

The pull-up and pull-down predrivers 215 and 220 each include CMOS inverters implemented using low-voltage transistors that might be damaged by application of a 1.5 volt VddIO signal when the system is operating in the HV mode. Additional transistors are therefore provided for voltage-stress protection. In this context, a transistor is characterized as "low voltage" if it exhibits a sensitivity to a destructive voltage lower than the high IO voltage between any two of its current-handling and control terminals (e.g., between any two of its source, drain, and gate).

Pull-up predriver 215 includes a CMOS inverter (series-connected transistors 235 and 240) and three parallel NMOS transistors 245 (shown as one transistor). A three-bit calibration signal pucal<2:0> is ANDed with an enable signal en to allow from zero to three of transistors 245 to couple the CMOS inverter to ground when predriver 215 is enabled. This control feature can be used to tune the rise time of signals from predriver 215, and consequently on pad 135.

Two PMOS transistors 250 and 255 protect the low-voltage transistors in the critical path through predriver 215 from the 1.5V VddIO used in the HV mode (when LV transmitter 125 is disabled) by setting the terminals of those transistors to protection voltage levels. These protection voltage levels are selected so that the voltage across any two of the source, drain, and gate of the sensitive transistors does not exceed the destructive voltage, the value of which is process dependent.

Transistor 255 has a gate dielectric thickness greater than those of the other transistors in predriver 215, and can consequently handle source-drain voltages above the destructive voltage (e.g., 1.0 volts) specified for the low-voltage transistors in the critical path. In the HV mode, protection transistors 250 and 255 connect internal nodes (i.e., nodes not connected directly to a supply node) of predriver 215 to core and supply voltages. In particular, transistor 255 holds the output node common to transistors 235 and 240 at a constant voltage (e.g., 1.5V) and transistor 250 pulls the node common to transistors 240 and 245 toward Vdd (e.g., 1.0V) to limit the voltages across transistors 235, 240, and 245. Transistor 255 ensures that the pull-up branch of the output stage (transistor 280) is completely shut down when the system is in HV mode.

Pull-down predriver 220 includes a CMOS inverter (series-connected transistors 260 and 265) and two additional PMOS transistors 270 and 275. PMOS transistor 270 is shown as one transistor in FIG. 2, but is implemented as three parallel PMOS transistors in this example. A three-bit calibration signal pdcalbIO<2:0>, level shifted to the VDDIO domain, is ORed with an active-low enable signal ~enIO to allow from zero to three transistors 270 to couple the CMOS inverter to supply voltage VddIO when predriver PreDrv_PD is enabled. This control feature can be used to tune the fall time of output signals from predriver 220.

Predrivers 215 and 220 respectively control the rise and fall times of signals on their output nodes in the LV mode, and consequently together control the slew-rate of the active edge of their corresponding output on pad 135. Delay adjust circuit DelAdj independently controls the phases of clock signals clk_pu and clk_pd to adjust rise and fall crossings at the driver output.

Driver 225 includes a pull-up branch with transistors 280 and 285 and a pull-down branch with transistors 290 and 295. The two transistors in each branch enable voltage-stress protection in the HV mode. Signals cp and cn to the control terminals of respective transistors 285 and 290 are independently controlled to selectively disable the pull-up and pull-down branches. These and other control features are discussed below in connection with Table 1. A poly resistor Rp is shared between the pull-up and pull-down branches of driver 225 to reduce output capacitance.

Table 1 lists the signals used to control transmitter 125 in accordance with one embodiment. In particular, mode-select circuit 230 decodes mode signal Mode to deliver control signals en, enIO, cp, and cn that collectively enable transmitter 125 to convey data Dtx or disable transmitter 125 in a protected state.

The first row of Table 1 represents the LV mode, in which case HV transmitter 115 of FIG. 1 is disabled, LV transmitter 125 is enabled, and IO voltage VddIO is set to the relatively low 1.0V level. Mode select circuit 230 drives signals cp and cn to ground and Vdd, respectively, which enables transistors 285 and 290, and consequently driver 225. Mode select circuit 230 additionally drives enable signals en and enIO to Vdd and VddIO, both of which are at 1.0V in the LV mode, to turn off transistors 250, 255, and 275. Predrivers 215 and 220 are thus configured to act as inverting amplifiers. Finally, though not shown in Table 1, mode select circuit 230 deasserts signals dc_selp and dc_seln to multiplexers 200 and 205 to allow odd and even data De and Do onto nodes inp and inn to be amplified by the predrivers, and by driver 225.

TABLE 1

| Mode | VddIO | cp | cn | en/enIO | inp | inn |
| --- | --- | --- | --- | --- | --- | --- |
| LV | 1.0 V | Gnd | Vdd | Vdd/VddIO | De/Do | De/Do |
| HV (LV Protected) | 1.5 V | Vdd | Vdd | Gnd/Gnd | Vdd | Vdd |
| LV (PU disabled) | 1.0 V | Vdd | Vdd | Vdd/VddIO | Gnd | De/Do |
| LV (PD disabled) | 1.0 V | Gnd | Gnd | Vdd/VddIO | De/Do | Vdd |

The second line of Table 2 represents the HV mode, in which case LV transmitter 125 is disabled and its low-voltage transistors protected from the higher VddIO value of 1.5V employed by the active HV transmitter 115 and receiver 120. Mode select circuit 230 drives signals cp and cn to Vdd. Mode select circuit 230 additionally drives enable signals en and enIO to ground to turn on PMOS transistors 250, 255, and 275. Consequently, transistor 255 turns off transistor 280 by holding its gate voltage at VddIO. Control signal ~enIO, the complement of enIO, is set to VddIO, which turns transistor 270 off. Finally, though not shown in Table 1, mode select circuit 230 asserts signals dc_selp and dc_seln to multiplexers 200 and 205 to block odd and even data De and Do from nodes inp and inn and cause node inn to be at the one level, shutting off transistor 295. As a result, driver stage 225 is disabled while the source voltages of transistor 290 stays at a voltage slightly lower than Vdd and the source voltage of transistor 285 stays at a voltage slightly higher than Vdd.

In the HV mode the thick-oxide transistor 255 is the only transistor within transmitter 125 that can experience a source-drain voltage above one volt. The sensitive high-performance transistors in the predrivers are thus protected from over-voltage conditions. The inputs to driver 225 from predrivers 215 and 220 are 1.5V and ground, respectively, and nodes cp and cn are both set to one volt. Thus biased, none of the transistors within driver 225 can experience a source-drain voltage as high as one volt, despite transitions on pad 135 due to the HV transmitter 115, the output of which can vary between about zero and 1.5 volts. Transistors 280, 285, 290, and 295 are therefore protected from over-voltage conditions.

Figure 3:
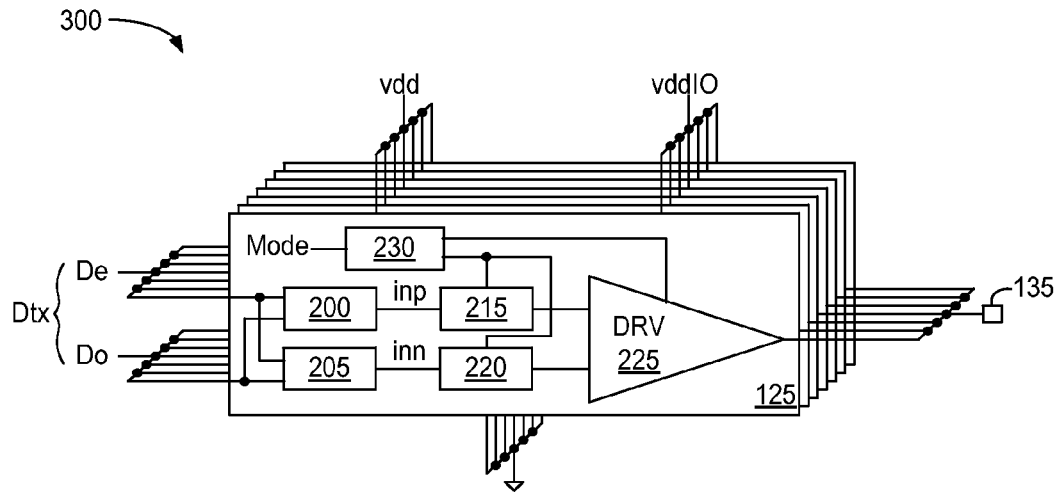
FIG. 3 depicts a transmitter 300 in accordance with an embodiment in which N parallel transmitters 125, e.g. of the type detailed previously, each act together as a transmitter slice.

FIG. 3 depicts a transmitter 300 in accordance with an embodiment in which N parallel transmitters 125, e.g. of the type detailed previously, each act together as a transmitter slice. In the HV mode, all of transmitters 125 are disabled as detailed previously. In the LV mode, however, any one of transmitters 125 can be disabled, or can have either its pull-up predriver 215 or pull-down predriver 220 disabled, so that the collective transmitter 300 exhibits desired pull-up and pull-down output impedances.

Returning to FIG. 2 and Table 1, the third line of Table 1 represents the LV mode in which the pull-up circuitry is disabled. Mode-select circuit 230 sets nodes cp and inp to Vdd and ground, respectively. This configuration disables both predriver 215 and the pull-up branch of driver 225. The fourth line of Table 1 supports a similar LV mode for disabling the pull-down predriver 220 and the pull-down branch of driver 225.

Figure 4:
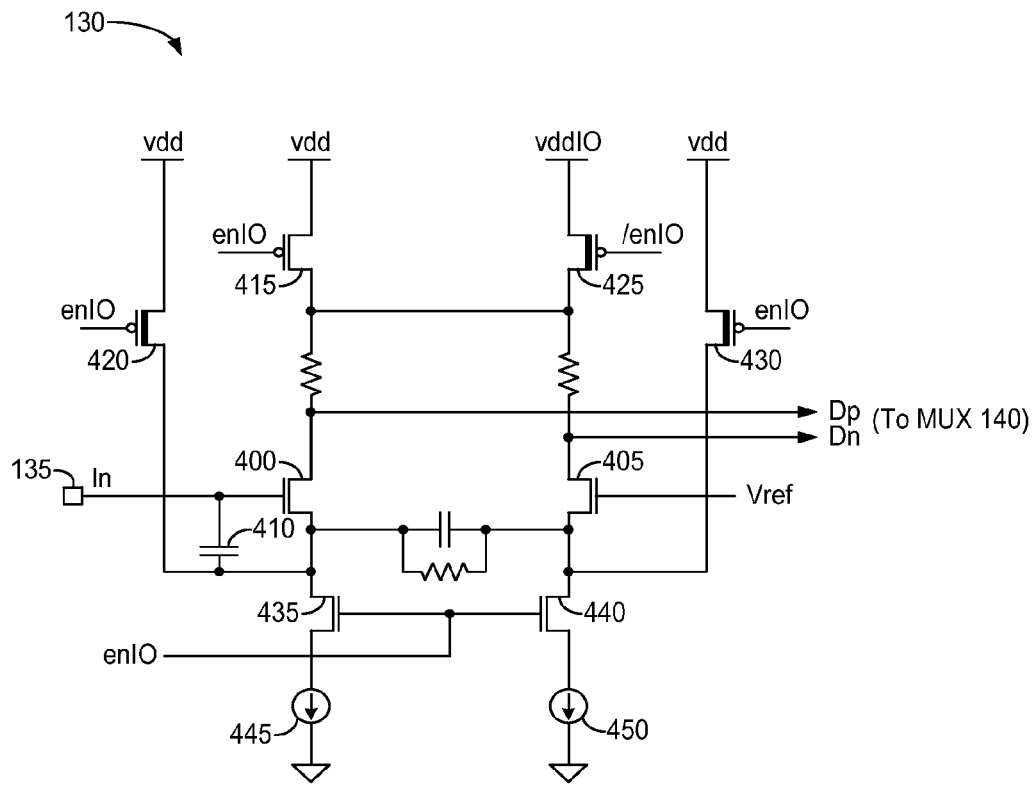
FIG. 4 details an embodiment of LV receiver 130 of FIG. 1.

FIG. 4 details an embodiment of LV receiver 130 of FIG. 1. Receiver 130 is a linear equalizer (LEQ) in this example, and is protected from over-voltage conditions associated with support for the HV mode as noted previously. Receiver 130 includes a differential pair of transistors 400 and 405 in the critical path, the control terminals of which are coupled to pad 135 and a reference voltage Vref, respectively. A capacitor 410 between the input and the tail node of the equalizer compensates for duty-cycle distortion due to single-ended common-mode noise.

A protection mechanism embedded in receiver 130 sets the terminals of the thin-oxide transistors to the appropriate protection voltage levels when receiver 130 is powered down and IO supply node VddIO is set to 1.5V in the HV mode. This mechanism includes four PMOS transistors 415, 420, 425, and 430, the last three of which are thick-oxide transistors.

In the LV mode, signal enIO is asserted (driven high) and its complementary signal /enIO is deasserted (driven low). Transistors 415, 420, and 430 are therefore turned off and transistor 425 is turned on. Tail transistors 435 and 440 are likewise turned on to allow current to flow through respective current sources 445 and 450. Differential transistor pair 400 and 405 thus steer current from supply node VddIO to ground via the alternative paths provided through transistors 400 and 405.

In the HV mode, signal enIO is deasserted (driven low) and its complementary signal /enIO is asserted (driven high). Transistors 415, 420, and 430 are therefore turned on and transistors 425, 435, and 440 are turned off. In this condition none of the sensitive transistors within receiver 130 experiences more than one volt across its terminals, and essentially no current flows through receiver 130.

Figure 5:
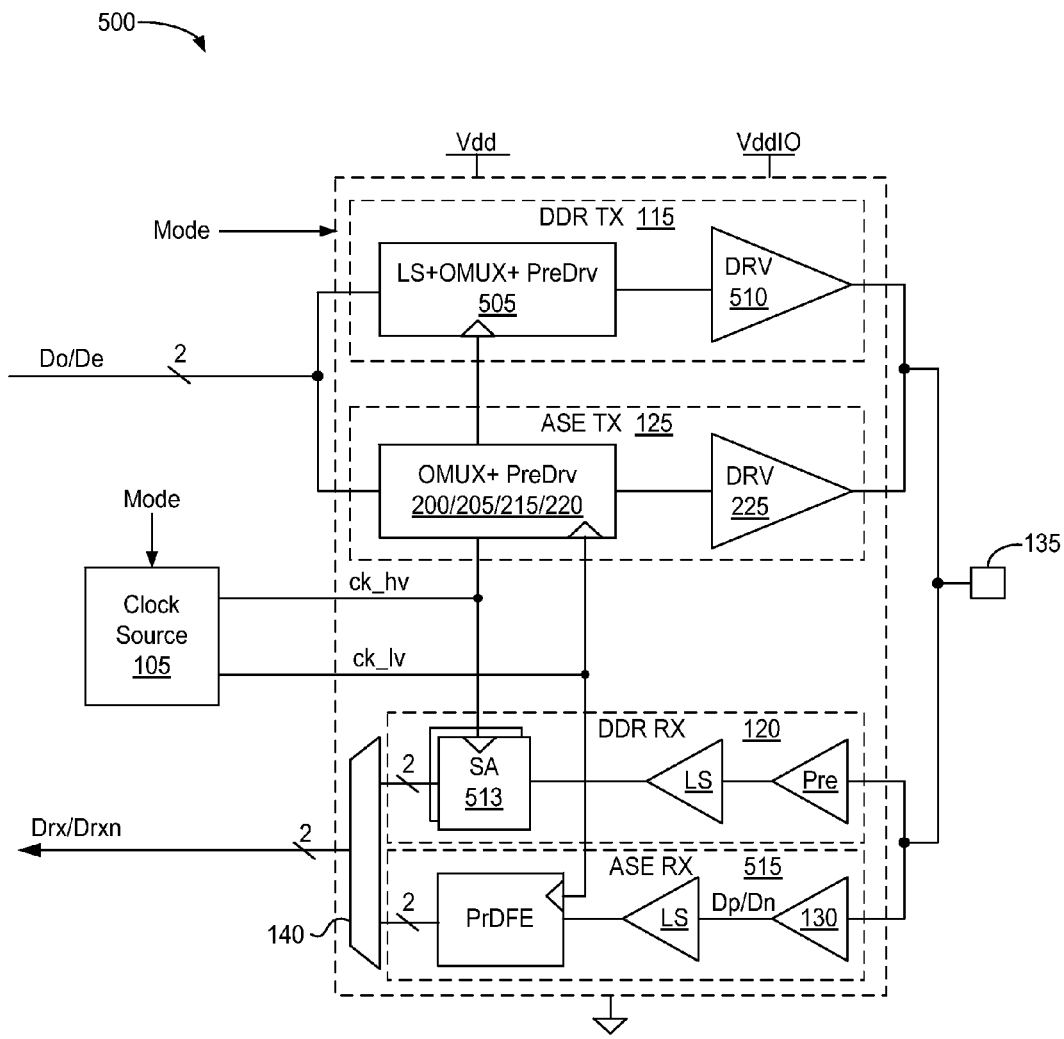
FIG. 5 depicts a communication system 500 in accordance with an embodiment instantiated using a 40 nm CMOS process.

FIG. 5 depicts a communication system 500 in accordance with an embodiment instantiated using a 40 nm CMOS process. System 500 is similar to system 100 of FIG. 1: like-identified elements can be the same or similar. System 500, a bit-slice in one embodiment, includes driver and receiver circuits that support both double data rate (DDR) and 12.8-GBps advanced single-ended (ASE) communication schemes. The DDR and ASE circuitry have different supply and bandwidth requirements, and are instantiated separately on a common IC. The DDR circuitry supports the DDR3 and GDDR5 protocols in one embodiment.

DDR transmitter 115 includes a level shifter LS, output multiplexer OMUX, and predriver PreDrv, collectively labeled 505, and a DDR output driver 510. DDR receiver 120 includes a predriver Pre, level shifter LS, and odd and even data samplers 513. The components of DDR transmitter 115 and receiver 120 are conventional, so a detailed discussion is omitted for brevity.

System 500 also includes a transmitter 125 as detailed previously, which is adapted to support the ASE communication scheme, and an ASE receiver 515. Receiver 515 includes receiver 130 (FIGS. 1 and 4), a level shifter LS, and a partial-response, decision-feedback equalizer (PrDFE). Level shifter LS and equalizer PrDFE are conventional, so a detailed discussion is omitted.

As in the prior examples, transmitter 125 and receiver 130 are implemented using thin-oxide transistors to support the target speed. DDR transmitter 115 and receiver 120 are turned on and provided with a 1.5V IO voltage VddIO in support of a relatively slow, high-voltage DDR legacy mode. Transmitter 125 and receiver 130 are turned off in the DDR mode and are configured to remain protected against the 1.5V IO voltage. The transmitters and receivers share one multi-modal phase-locked loop (not shown), which includes a voltage-controlled ring oscillator (VCO) covering 3.2-GHz to 8-GHz, and an LC phase-locked loop (PLL) covering 5.5-GHz to 7-GHz.

In both receive and transmit directions, driver impedance is 40-Ohm with 60-Ohm termination to the 1.0V IO supply at the receive side in one embodiment. ASE driver 225 is voltage-mode, and can support equalization and impedance calibration. Receiver 130, a linear equalizer in this example, exhibits 3-dB of peaking, and PrDFE can be e.g. a 1-tap predictive decision feedback equalizer. In an embodiment in which system 500 supports a read/write channel for a DRAM memory, statistical simulations with representative models of a DRAM package may be used to set the specifications for the controller such that healthy READ and WRITE margins are maintained with a DRAM that presents 1.0 pF of capacitance to the channel at each pad, supports receive linear equalization with 3-dB of peaking during WRITE, and no transmit equalization during READ.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Multi-conductor signal lines may alternatively be single-conductor signal lines, and each of the single-conductor signal lines may alternatively be multi-conductor signal lines. Signals and signaling paths shown or described as being single-ended may also be differential, and vice versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. In any case, whether a given signal is an active low or an active high will be evident to those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. An integrated circuit comprising:
   an input/output (IO) supply node to supply a low IO voltage in a low-voltage mode or a high IO voltage in a high-voltage mode;
   a data input port and a data output port; and
   alternative low-voltage and high-voltage communication circuits connected between the data input port and the data output port, and to the IO supply node, the low-voltage and high-voltage communication circuits to convey data signals between the data input port and the data output port in the respective low-voltage and high-voltage modes;
   the low-voltage communication circuit further including:
      low-voltage transistors defining a critical path for the data signals in the low-voltage mode, each of the low-voltage transistors having first and second current-handling terminals and a control terminal and exhibiting a sensitivity to a destructive voltage less than the high IO voltage between any two of the first and second current-handling terminals and the control terminal;
      wherein the low-voltage communication circuit is inactive in the high-voltage mode and the first and second current-handling terminals and the control terminals are set to protection voltage levels in the high-voltage mode.

2. The integrated circuit of claim 1, the low-voltage communication circuit further comprising protection transistors connected to the critical path to set at least a subset of the terminals to the protection voltage levels in the high-voltage mode.

3. The integrated circuit of claim 2, wherein the low-voltage transistors include low-voltage gate insulators, and at least one of the protection transistors comprises a high-voltage gate insulator thicker than the low-voltage gate insulators.

4. The integrated circuit of claim 1, wherein the critical path comprises pull-up and pull-down paths.

5. The integrated circuit of claim 4, wherein the critical path includes a driver having first and second inputs connected to the pull-up and pull-down paths, respectively.

6. The integrated circuit of claim 5, wherein the driver includes a set of the low-voltage transistors connected in series from the IO supply node.

7. The integrated circuit of claim 6, wherein the set of the low-voltage transistors forms a pull-up leg in the pull-up path and a pull-down leg in the pull-down path.

8. The integrated circuit of claim 7, wherein the pull-up leg includes a first pair of the low-voltage transistors connected in series between the IO supply node and the data output port and the pull-down leg includes a second pair of the low-voltage transistors connected in series between a second supply node and the data output port.

9. The integrated circuit of claim 8, wherein the control terminal of a low-voltage transistor in each of the legs receives a DC control voltage, and wherein at least one of the DC control voltages is different in the high-voltage mode than in the low-voltage mode.

10. The integrated circuit of claim 9, wherein the at least one of the DC control voltages is set to one of the protection voltage levels in the high-voltage mode.

11. The integrated circuit of claim 9, wherein the control terminal of one of the two low-voltage transistors in each leg receives alternative DC control voltages.

12. The integrated circuit of claim 9, wherein another low-voltage transistor in each of the legs is driven by a respective pre-driver to convey the data signals.

13. The integrated circuit of claim 8, wherein the control terminal of one of the two low-voltage transistors in one of the legs is connected to the IO supply node in the high-voltage mode and conveys the data signals in the low-voltage mode.

14. The integrated circuit of claim 13, wherein the control terminal of one of the two low-voltage transistors in the other of the legs is connected to a second supply node in the high-voltage mode and conveys the data signals in the low-voltage mode.

15. The integrated circuit of claim 1, further comprising mode-select circuitry connected to the communication circuits to enable and disable the respective low-voltage and high-voltage communication circuits in the low-voltage mode and to disable and enable the respective low-voltage and high-voltage communication circuits in the high-voltage mode.

16. A driver supporting first and second communication modes, the driver comprising:
 a first supply node to supply a first core supply voltage;
 a second supply node to supply a second core supply voltage;
 a third supply node to alternatively supply first or second input/output (IO) voltages relative to the first core supply voltage, the first IO voltage being supplied in the first communication mode and the second IO voltage, greater than the first IO voltage, being supplied in the second communication mode;
 a driver amplifier extending between the first and third supply nodes and having first and second driver input nodes and a driver output node; and
 a first predriver coupled between the first supply node and each of the second and third supply nodes, the first predriver including a first predriver output node coupled to the first driver input node, wherein the first predriver output node transitions between the first core supply voltage and the first IO voltage in the first communication mode and remains at the second IO voltage in the second communication mode.

17. The driver of claim 16, further comprising:
 a second predriver coupled between the first supply node and each of the second and third supply nodes, the second predriver including a second predriver output node coupled to the second driver input node, wherein the second predriver output node transitions between the first core supply voltage and the first IO voltage in the first communication mode and remains at the first core supply voltage in the second communication mode.

18. The driver of claim 16, wherein the driver amplifier includes two pull-down transistors coupled in series between the driver output node and the first supply node and two pull-up transistors coupled in series between the driver output node and the third supply node.

19. The driver of claim 18, wherein each of the transistors includes a control terminal, and wherein the pull-up and pull-down transistors connected to the driver output node have their control terminals set to the first IO voltage in the second communication mode.

20. The driver of claim 16, wherein the first predriver includes a thick-oxide transistor coupled between the third supply node and the first predriver output node, and wherein the thick-oxide transistor pulls the first predriver output node to the second IO voltage in the second communication mode.

21. The driver of claim 16, wherein the driver amplifier is one of a plurality of driver-amplifier slices extending between the first and third supply nodes, and wherein the first and second driver input nodes and the driver output nodes are common to each of the slices.

22. The driver of claim 16, wherein the first predriver is one of a plurality of predriver slices coupled between the first supply node and each of the second and third supply nodes, and wherein the first predriver output node of the predriver slices are common to each of the predriver slices.

23. A computer-readable medium having stored thereon a data structure defining a driver adapted to transmit output signals in first and second communication modes, the data structure comprising:
 first data representing a first supply node to supply a first core supply voltage;
 second data representing a second supply node to supply a second core supply voltage;
 third data representing a third supply node to alternatively supply, relative to the first core supply voltage, a first input/output (IO) voltage in the first communication mode or a second IO voltage, greater than the first IO voltage, in the second communication mode;
 fourth data representing a driver amplifier extending between the first and third supply node and having first and second driver input nodes and a driver output node; and
 fifth data representing a predriver coupled between the first supply node and each of the second and third supply nodes, the predriver including a predriver input node and a predriver output node coupled to the first driver input node, wherein the predriver output node transitions between the first core supply voltage and the first IO voltage in the first communication mode and remains at the second IO voltage in the second communication mode.

24. A method for supporting a high-voltage (HV) signaling scheme and a low-voltage (LV) signaling scheme for communicating a signal using alternative HV and LV communication circuits, the method comprising:
 in an HV mode supporting the HV signaling scheme,
  providing an HV IO voltage to the HV communication circuit,
  providing an HV IO voltage to a critical path in the LV communication circuit,
  setting terminals of low-voltage transistors in the critical path to protection voltage levels, and
 in an LV mode supporting the LV signaling scheme,
  providing an LV IO voltage to the LV communication circuit, and
  communicating the signal via the critical path of the LV communication circuit.

25. The method of claim 24, wherein the LV communication circuit includes a thin-gate-dielectric transistor and a thick-gate-dielectric transistor, and wherein providing the HV IO voltage to the critical path of the LV communication circuit comprises turning the thick-gate-dielectric transistor on.

* * * * *